(12) United States Patent
Yeo

(10) Patent No.: US 6,683,543 B1
(45) Date of Patent: Jan. 27, 2004

(54) ABSOLUTE ENCODER BASED ON AN INCREMENTAL ENCODER

(75) Inventor: Chiau Woon Yeo, Penang (MY)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/356,438

(22) Filed: Jan. 30, 2003

(51) Int. Cl.$^7$ ................................................ H03M 1/22
(52) U.S. Cl. ............................. 341/13; 341/11; 341/2; 250/231
(58) Field of Search ................................ 341/13, 11, 2; 250/231

(56) References Cited

U.S. PATENT DOCUMENTS

| | | | |
|---|---|---|---|
| 4,730,110 A | * | 3/1988 | Spaulding ...................... 341/2 |
| 4,740,690 A | * | 4/1988 | Mosier ........................ 341/13 |
| 4,782,327 A | * | 11/1988 | Kley et al. .................... 341/13 |
| 4,788,422 A | * | 11/1988 | Fujiwara ...................... 341/13 |
| 4,933,673 A | * | 6/1990 | Ishizuka et al. ............... 341/13 |
| 5,038,243 A | * | 8/1991 | Gordon ......................... 341/2 |
| 5,049,879 A | * | 9/1991 | Symonds ...................... 341/13 |
| 5,274,203 A | * | 12/1993 | Skalski et al. ................. 341/2 |
| 6,542,088 B1 | * | 4/2003 | Bielski et al. ................ 341/13 |

* cited by examiner

Primary Examiner—Michael Tokar
Assistant Examiner—Lam Mai

(57) ABSTRACT

An encoder that includes a sensing device that senses encoding marks on a sensing surface that also includes one or more reference marks. The sensing device generates first and second encoder signals when the encoding marks pass the sensing device. The encoding signals define the direction of motion and degree of movement of the sensing surface. A register stores the position of the encoding surface relative to the sensing device. A controller receives the first and second encoder signals and increments or decrements the digital register based on the received first and second encoder signals. The encoder also includes a reference mark detector that generates a first reference mark signal when the first reference mark passes the reference mark detector. The controller resets the digital value to a first reference value when the encoder receives the first reference mark signal.

6 Claims, 3 Drawing Sheets

ABSOLUTE ENCODER BASED ON AN INCREMENTAL ENCODER

FIELD OF THE INVENTION

The present invention relates to encoders.

BACKGROUND OF THE INVENTION

To simplify the following discussion, the present invention will be explained in terms of a shaft encoder. A shaft encoder outputs a digital signal that indicates the position of the shaft relative to some known reference position. An absolute shaft encoder typically utilizes a plurality of tracks on a disk that is connected to the shaft. Each track consists of a series of dark and light stripes that are viewed by a detector that outputs a value of digital 1 or 0, depending on whether the area viewed by the detector is light or dark. An N-bit binary encoder typically utilizes N such tracks, one per bit.

If N is large, alignment of the various components presents significant problems. In addition to the problems associated with aligning the tracks, the photodetectors must also be aligned with one another. The need to provide precise alignment of the components significantly increases the cost of the encoder when N is large.

Incremental encoders, in contrast, are relatively inexpensive. An N-bit incremental encoder may be viewed as the track corresponding to the least significant bit in an N-bit absolute encoder. That is, the track consists of $2^N$ regions that alternate between dark and light. The encoder determines absolute distance by incrementing or decrementing a counter each time the photodetector associated with the track changes its output depending on the direction of travel of the encoding track relative to the photodetector. The direction of travel of the encoding track is sensed by a utilizing two photodetectors that are shifted with respect to one another. Since the incremental encoder does not have a large number of tracks to align, the alignment costs discussed above are avoided. As long as the device does not miss a count, the counter value is a measure of the position relative to the point on the encoding wheel at which the count was 0. Unfortunately, a loss of power results in a loss of the count, and hence, the position becomes unknown. In addition, errors from a missed count or detector noise can also introduce errors into the position measurement.

SUMMARY OF THE INVENTION

The present invention includes an encoder that includes a sensing device that senses encoding marks on a sensing surface that also includes one or more reference marks. The sensing device generates first and second encoder signals when the encoding marks pass the sensing device. The second encoder signal leads or lags the first encoder signal depending on the direction of the movement of the sensing surface with respect to the sensing device. The encoder includes a register for storing a digital value indicative of the position of the encoding surface relative to the sensing device. A controller receives the first and second encoder signals and increments or decrements the digital register based on the received first and second encoder signal. The encoder also includes a reference mark detector that generates a first reference mark signal when the first reference mark passes the reference mark detector. The controller resets the digital value to a first reference value when the encoder receives the first reference mark signal. In one embodiment of the invention, the encoder also includes a non-volatile memory for storing a register value and a power detection circuit for determining if the potential on a power supply line is decreasing and increasing. In this embodiment, the controller causes the digital value in the register to be stored in the non-volatile memory when the power detection circuit determines that the potential on a power supply line is decreasing. When the power detection circuit determines that the potential of the power supply line is rising, the controller causes the value stored in the non-volatile memory to be stored in the register.

BRIEF DESCRIPTION OF THE INVENTION

DETAILED DESCRIPTION OF THE PREFERRED EMBODIMENTS OF THE INVENTION

Figure 1:
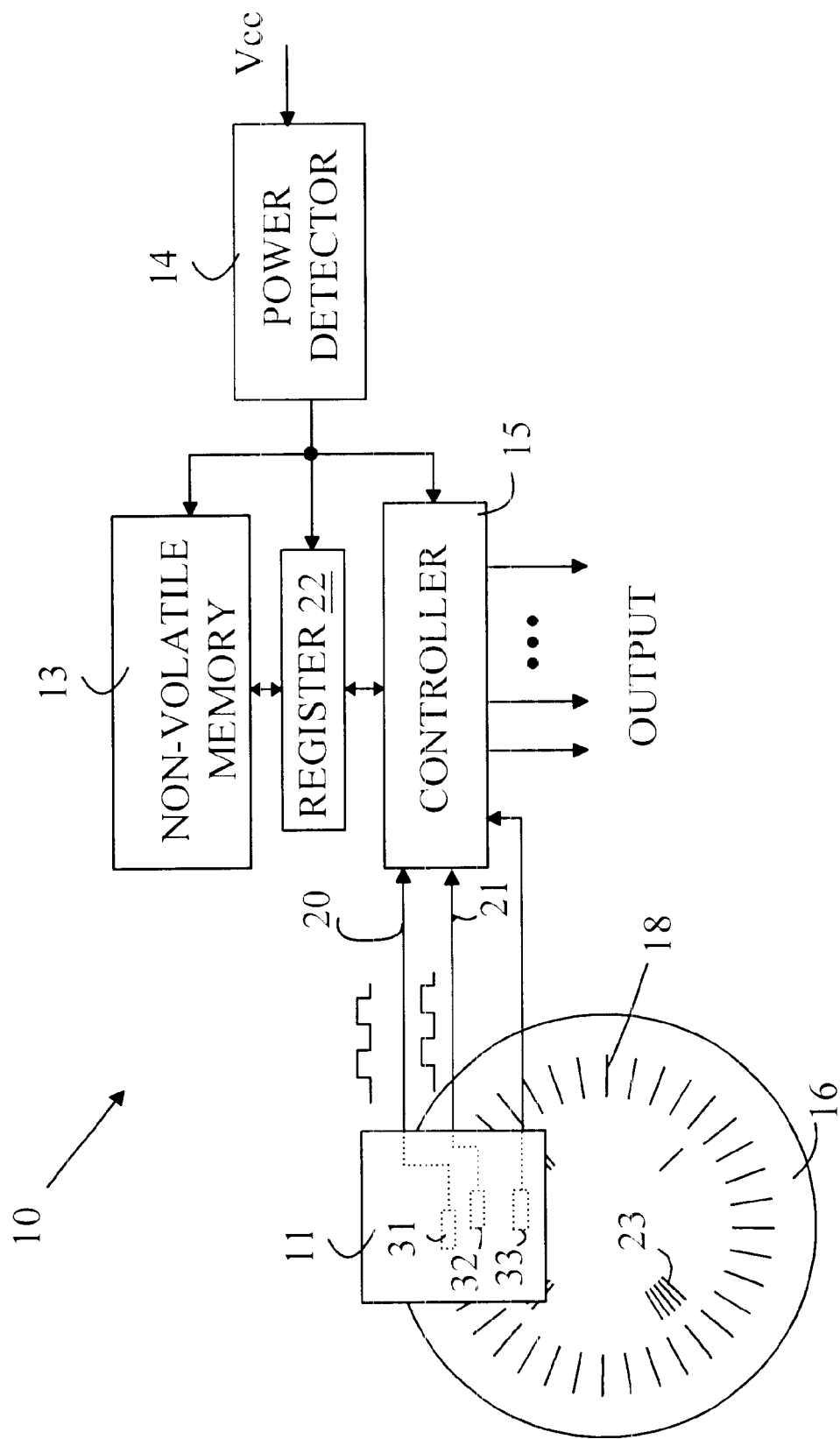
FIG. 1 illustrates one embodiment of an encoder 10 according to the present invention.

The manner in which the present invention provides its advantages can be more easily understood with reference to FIG. 1, which illustrates one embodiment of an encoder 10 according to the present invention. Encoder 10 utilizes an encoding wheel 16 that is attached to a shaft that 17 that can rotate clockwise or counterclockwise. Encoding wheel 16 has a plurality of encoding bands 18 that are sensed by a quadrature sensor 11 that generates two signals that are 90 degrees out of phase. Quadrature sensors of this type are conventional in the art, and hence, will not be discussed in detail here. For the purposes of this discussion, it is sufficient to note that quadrature sensor 11 includes two photodetectors shown at 31 and 32 that are offset from one another by ¼ the period of the encoding bands. The outputs from these detectors are utilized to generate signals on lines 20 and 21. The signal on line 20 will lead or lag the signal on line 21 by 90 degrees depending on the direction of rotation of shaft 17. While the encoding bands are shown as radial lines in the drawing, it is to be understood that these bands are typically alternating black and white bands of equal width.

The signals from quadrature sensor 11 are received by controller 15. Controller 15 includes a register 22 that is incremented or decremented on each leading edge of the signal on line 20. The state of the signal on line 21 is utilized in conjunction with the signal on line 20 to determine the direction of motion of encoding wheel 16. In this exemplary embodiment, register 22 is incremented if the encoding wheel is rotating in the clockwise direction and decremented if the encoding wheel is rotating in the counter clockwise direction. The manner in which controller 15 makes this determination will be discussed in more detail below.

Encoder 10 also includes a non-volatile memory 13 that stores the count in register 22 when power detection circuit 14 determines that power is failing. When encoder 10 powers up again, as determined by power detection circuit 14, the value stored in memory 13 is reloaded into register 22. Hence, the power failure reliability problems normally associated with incremental encoders are substantially reduced with the present invention.

While the power failure system described above significantly reduces errors, register 22 can still be in error. For example, if the encoding wheel or the shaft on which it is mounted moves while the power is off, register 22 will not be properly updated, and hence, the indicated position of the encoding wheel will be in error. In addition, when the encoder first starts up, the location of the wheel, and hence, the zero position of register 22 is unknown.

The present invention overcomes this problem by providing one or more absolute reference marks on encoding wheel 16. In the embodiment shown in FIG. 1, these reference marks are sensed by a sensor 33 that is part of quadrature sensor 11; however, the reference sensor can be a separate device that is independent of quadrature sensor 11. In the embodiment shown in FIG. 1, four reference marks are utilized. An exemplary reference mark is shown at 23.

If more than one reference mark is utilized, each reference mark preferably provides a unique signal so that the controller can determine the identity of the reference mark. In the embodiment shown in FIG. 1, the reference marks are radial marks. The identity of each reference mark is specified by the number of radial marks that are grouped together. For the purpose of this discussion, it will be assumed that the reference point on the encoding wheel marked by each reference mark is the position of the first radial mark encountered by the reference sensor. The exact position of this reference mark will depend on the direction of travel in the example shown in FIG. 1.

Controller 15 preferably includes a table that stores the absolute position of each reference mark in terms of the expected count in register 22 when the reference mark is encountered. If, as noted above, the reference marks are wide, this table may include an entry for each mark and the direction of rotation of the encoding wheel.

When a reference mark passes the reference sensor, a signal is sent to controller 15 which checks the contents of register 22 against the table entry for that reference mark and direction of travel. If the expected register value is not found, controller 15 corrects the value in register 22 so that register 22 will read the expected value when the next reference mark is encountered. Hence, if an error occurs, the encoder will correct the error quickly. In the embodiment shown in FIG. 1, the error will be corrected within one-quarter turn of the encoder.

Finally, it should be noted that controller 15 preferably outputs a binary number that is determined by the contents of register 22. In the preferred embodiment of the present invention, the output is the same as that provided by a conventional absolute encoder so that the present invention can be used as a replacement for such encoders.

As noted above, the present invention preferably utilizes a power detector circuit 14 for determining when power is lost and regained. Upon detecting a falling power supply voltage, the detector signals the controller which, in turn, causes the value in register 22 to be stored in memory 13. This scheme assumes that controller 15 has a power source with sufficient power storage to enable controller 15 to perform these operations when the power detector signals a power failure. Power storage devices based on capacitors or batteries can be utilized for this purpose.

Figure 2:
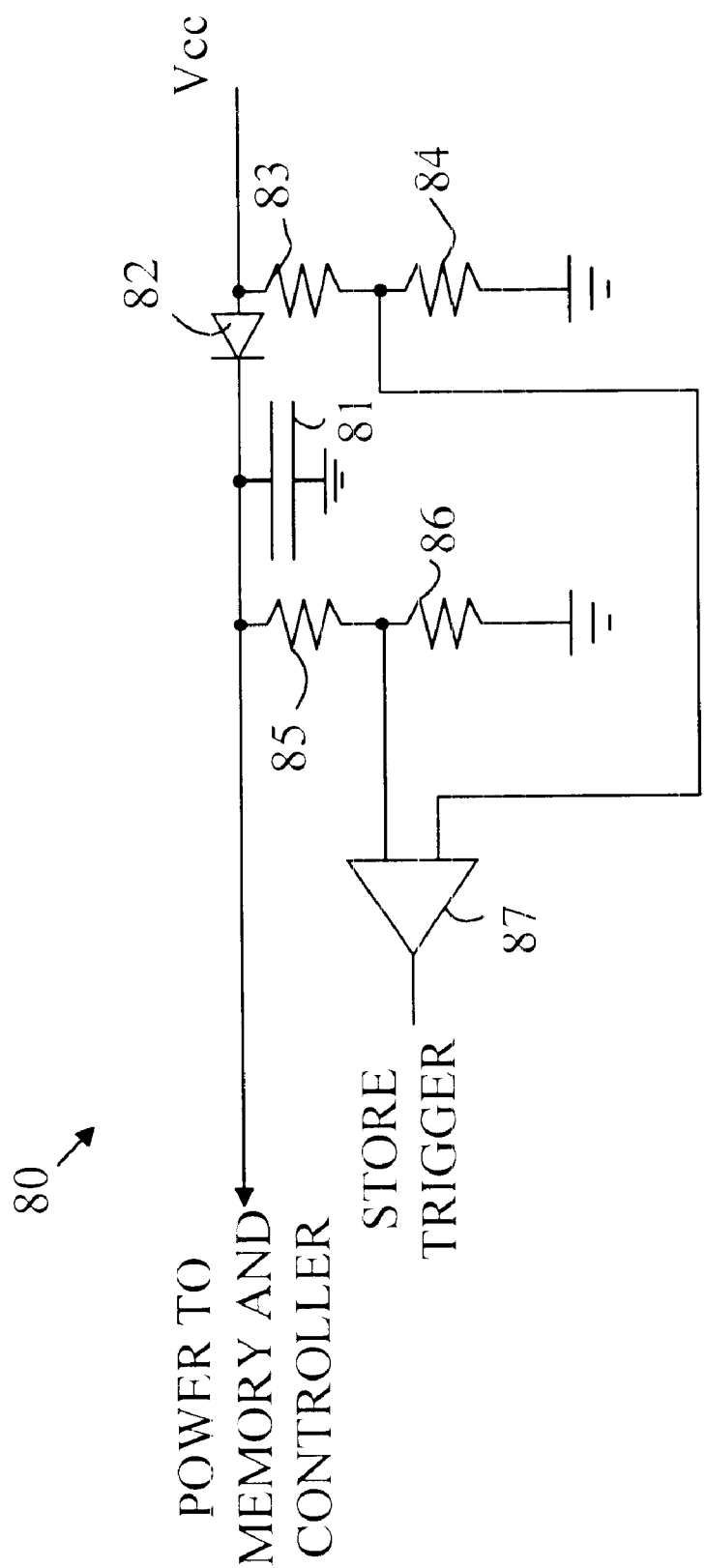
FIG. 2 is a schematic drawing of one embodiment of a power detector circuit 80.

Refer now to FIG. 2, which is a schematic drawing of one embodiment of a power detector circuit 80 that can be used with the present invention. Power detector circuit 80 is powered from the Vcc bus used to power the electronics associated with the encoding wheel such as the LEDs, photodiodes, etc. Power is provided to the controller and memory from a capacitor 81 that is charged from Vcc through diode 82, which prevents the charge from leaking off of capacitor 81 if power is lost. When power is lost, Vcc goes to ground much more quickly than the voltage across capacitor 81; hence, comparator 87 will detect a difference in the inputs thereto and generate a trigger signal that is received by controller 15 and used by the controller to trigger the storage of the count in register 22 into non-volatile memory 13. The inputs to comparator 87 are generated by two resistive dividers shown at 83–84 and 85–86.

It should be noted that the power failure detection feature of the present invention is optional if the reference mark system discussed above is utilized. If the device is powered off and the contents of register 22 are lost, the device will regain the correct value as soon as the encoding wheel passes one of the reference marks.

As noted above, the present invention depends on being able to determine the direction of motion of encoding wheel 16 from the outputs of the quadrature sensor 11. A simple state machine may be utilized for this purpose. Denote the signal on line 20 by X and the signal on line 21 by Y. X and Y can take on the values 0 and 1 depending on whether or not the signal is high or low. There are four possible states XY. In one direction, the states are 01 to 00 to 10 to 11. In the other direction of motion, the states proceed from 01 to 11 to 10 to 00. Hence, controller 15 only needs to keep track of the previous state and the current state to determine the direction of motion.

Figure 3:
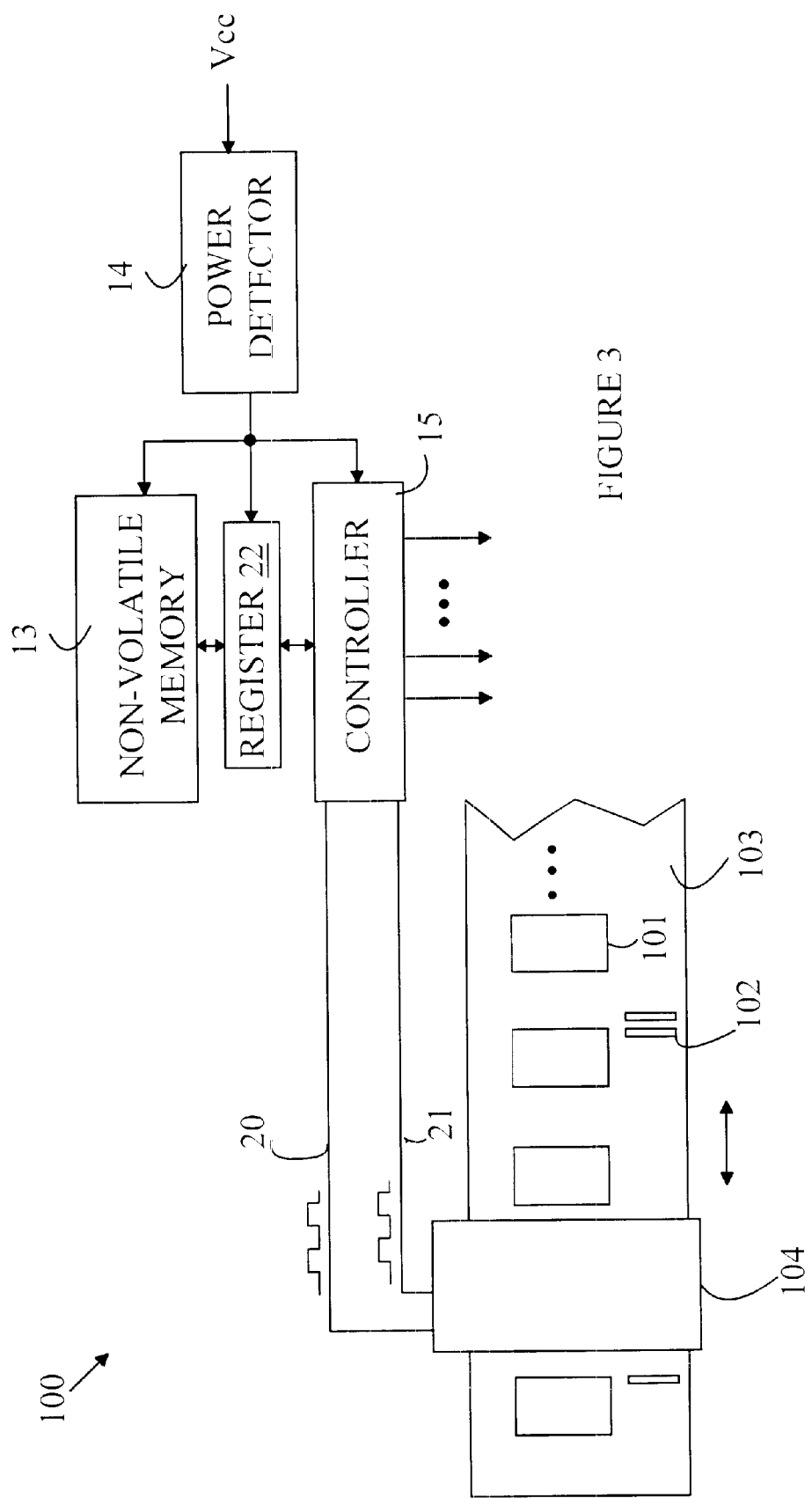
FIG. 3 illustrates a linear encoder 100 according to another embodiment of the present invention.

The embodiments of the present invention discussed above have utilized a circular encoding wheel to track the position of a shaft that rotates. However, an embodiment of the present invention that operates on a linear encoding strip that tracks the position of a linear actuator can also be constructed. Refer now to FIG. 3, which illustrates a linear encoder 100 according to another embodiment of the present invention. To simplify the following discussion, those elements of encoder 100 that serve the same function as the corresponding elements in FIG. 1 have been assigned the same reference numerals and will not be discussed further here. In this embodiment, the encoding bars 101 and reference marks 102 are arranged on a linear strip 103 that moves under a quadrature sensor 104 similar to that discussed above with reference to the embodiment shown in FIG. 1. As strip 103 moves back and forth, controller 15 increments or decrements the contents of register 22 in the same manner as described above.

The above-described embodiments of the present invention utilize a quadrature detector to generate a pair of signals that indicate both the degree of motion of the sensing surface relative to the detector and the direction of that motion. While the preferred embodiment of the present invention utilizes a conventional quadrature detector, any detector that generates two signals that provide this information can be utilized.

Various modifications to the present invention will become apparent to those skilled in the art from the foregoing description and accompanying drawings. Accordingly, the present invention is to be limited solely by the scope of the following claims.

What is claimed is:

1. An encoder comprising:
   a sensing device that generates first and second encoder signals;
   a sensing surface comprising a plurality of uniformly spaced encoding marks, said surface moving with respect to said sensing device such that said first and second encoder signals are generated when said encoding marks pass said sensing device, said second encoder signal leading or lagging said first encoder signal depending on the direction of said movement of said sensing surface with respect to said sensing device;

a reference mark detector for detecting said first reference mark and generating a first reference mark signal indicative of said detection;

a register for storing a digital value; and a controller for receiving said first and second encoder signals and for incrementing or decrementing said digital register based on said received first and second encoder signals, wherein said controller resets said digital value to a first reference value when said encoder receives said first reference mark signal.

2. The encoder of claim 1 further comprising:

a non-volatile memory for storing a register value; and a power detection circuit for determining if the potential on a power supply line is decreasing and increasing, wherein said controller causes said digital value to be stored in said non-volatile memory when said power detection circuit determines that said potential is decreasing.

3. The encoder of claim 2 wherein said controller causes said stored register value to be loaded into said register when said power detection circuit determines that said potential is rising.

4. The encoder of claim 1 wherein said encoding surface further comprises a second encoding mark, wherein said reference detector generates a second reference mark signal when said second encoding mark is detected, and wherein said controller resets said digital value to a second reference value when said second reference mark signal is generated.

5. The encoder of claim 1 wherein said encoding surface comprises a disk connected to a shaft that rotates with respect to said sensing device when said shaft turns.

6. The encoder of claim 1 wherein said encoding surface comprises a strip that moves with respect to said sensing device when said surface moves parallel to a predetermined direction.

* * * * *